(12) United States Patent
Bessant et al.

(10) Patent No.: US 12,016,397 B2
(45) Date of Patent: Jun. 25, 2024

(54) FALL RESPONSE PROCEDURES FOR AEROSOL-GENERATING DEVICES

(71) Applicant: PHILIP MORRIS PRODUCTS S.A., Neuchâtel (CH)

(72) Inventors: Michel Bessant, Neuchâtel (CH); Guillaume Colotte, Lausanne (CH); Jennifer Ernestine Emma Plun, Neuchâtel (CH)

(73) Assignee: Philip Morris Products S.A., Neuchâtel (CH)

( * ) Notice: Subject to any disclaimer, the term of this patent is extended or adjusted under 35 U.S.C. 154(b) by 785 days.

(21) Appl. No.: 17/042,496

(22) PCT Filed: Mar. 28, 2019

(86) PCT No.: PCT/IB2019/052565
§ 371 (c)(1),
(2) Date: Sep. 28, 2020

(87) PCT Pub. No.: WO2019/186468
PCT Pub. Date: Oct. 3, 2019

(65) Prior Publication Data
US 2021/0007406 A1 Jan. 14, 2021

(30) Foreign Application Priority Data
Mar. 29, 2018 (EP) .................................. 18165141

(51) Int. Cl.
*A24F 40/53* (2020.01)
*A24F 40/50* (2020.01)
(Continued)

(52) U.S. Cl.
CPC ............. *A24F 40/53* (2020.01); *A24F 40/50* (2020.01); *A24F 40/51* (2020.01); *A24F 40/60* (2020.01);
(Continued)

(58) Field of Classification Search
CPC .......... A24F 40/53; A24F 40/51; A24F 40/50; A24F 40/60
See application file for complete search history.

(56) References Cited

U.S. PATENT DOCUMENTS

2008/0087085 A1   4/2008 Ueda et al.
2008/0218366 A1   9/2008 Chen
(Continued)

FOREIGN PATENT DOCUMENTS

CN    104834583 A    8/2015
EP     1158511 A2    11/2001
(Continued)

OTHER PUBLICATIONS

European Search Report for EP 22168475.6 issued by the European Patent Office dated Jul. 1, 2022; 16 pgs.
(Continued)

*Primary Examiner* — Christopher M Rodd
*Assistant Examiner* — Jennifer A Kessie
(74) *Attorney, Agent, or Firm* — Mueting Raasch Group

(57) ABSTRACT

A response procedure for an aerosol-generating device includes detecting a fall or shock using at least one acceleration value and initiating at least one response procedure using a controller. Acceleration values are provided by at least one accelerometer coupled to the aerosol-generating device. The response procedures may include at least one of: initiating a mechanical change in the aerosol-generating device, initiating a modification to an external device interface, generating a human-perceptible beacon, storing data associated with the fall or shock in persistent or non-volatile memory, initiating a diagnostic routine, monitoring for a lost device condition, and initiating a soft shutdown or restart.

20 Claims, 3 Drawing Sheets

(51) Int. Cl.
   *A24F 40/51* (2020.01)
   *A24F 40/60* (2020.01)
   *A24F 40/65* (2020.01)
   *G01P 15/18* (2013.01)
   *G01R 27/02* (2006.01)

(52) U.S. Cl.
   CPC .............. *A24F 40/65* (2020.01); *G01P 15/18* (2013.01); *G01R 27/02* (2013.01)

(56) References Cited

U.S. PATENT DOCUMENTS

| | | |
|---|---|---|
| 2010/0109894 A1 | 5/2010 | Wu |
| 2012/0177351 A1 | 7/2012 | Yasuda et al. |
| 2015/0257445 A1* | 9/2015 | Henry, Jr. ................ A24F 40/50 131/328 |
| 2016/0021930 A1* | 1/2016 | Minskoff ................ A24F 40/51 392/395 |
| 2016/0158782 A1* | 6/2016 | Henry, Jr. ................ A24F 40/53 700/275 |
| 2017/0024300 A1 | 1/2017 | Nomoto et al. |
| 2017/0156397 A1* | 6/2017 | Sur ........................ A24F 40/51 |
| 2017/0234906 A1 | 8/2017 | Moore et al. |
| 2018/0020727 A1 | 1/2018 | Hoffman et al. |

FOREIGN PATENT DOCUMENTS

| | | |
|---|---|---|
| GB | 2540135 A | 11/2017 |
| JP | 2001331281 A | 11/2001 |
| JP | 2005346566 A | 12/2005 |
| JP | 2006254207 A | 9/2006 |
| JP | 2008042495 A | 2/2008 |
| JP | 2009225201 A | 10/2009 |
| JP | 2012147192 A | 8/2012 |
| JP | 2015070402 A | 4/2015 |
| JP | 2017026459 A | 2/2017 |
| RU | 2607067 C2 | 1/2017 |
| RU | 2644314 C2 | 2/2018 |
| WO | WO 2014/058678 A1 | 4/2014 |
| WO | WO 2014/060267 A2 | 4/2014 |
| WO | WO 2018/027189 A2 | 2/2018 |

OTHER PUBLICATIONS

Russian Office Action for RU 2020135321, issued by the Patent Office of the Russian Federation dated Jul. 14, 2022; 14 pgs.
European Search Report issued for EP 18165141.5 by the European Patent Office dated Oct. 8, 2018: 9 pgs.
International Search Report and Written Opinion for PCT/IB2019/05265 issued by the European Patent Office dated Jul. 19, 2019; 14 pgs.
International Preliminary Report on Patentability for PCT/IB2019/052565 issued by the European Patent Office dated Jul. 6, 2020: 26 pgs.
"Detecting Freefall with Low-G Accelerometers," Freescale Semiconductor, Inc., AN3151; Tempe, AZ; Nov. 2006; 8 pgs.
Japanese Office Action for JP Application No. 2020-549764 issued by the Japanese Patent Office, dated Feb. 6, 2023; 15 pgs. Including English translation.

* cited by examiner

FALL RESPONSE PROCEDURES FOR AEROSOL-GENERATING DEVICES

This application is the § 371 U.S. National Stage of International Application No. PCT/IB2019/052565, filed 28 Mar. 2019, which claims the benefit of European Application No. 18165141.5, filed 29 Mar. 2018, the disclosures of which are incorporated by reference herein in their entireties.

This disclosure relates to fall detection and related response procedures for an aerosol-generating device and, specifically, to response procedures initiated in response to one or more acceleration values.

Handheld aerosol-generating devices, such as cartomizer electronic cigarettes, are known, which utilize liquid to be evaporated or solid material (which may contain tobacco) to be heated to generate an inhalable aerosol. These devices may provide an alternative experience to conventional combustion cigarettes. Some devices may adopt a similar look and feel to conventional cigarettes, which may be familiar, easy to handle, portable, and easy to manufacture. In contrast to conventional cigarettes, electronic cigarettes may have electronics and other components that may be damaged due to the impact of a fall or shock. Such damage may undesirably affect proper functioning of the device. Servicing the device by customer care may be difficult without knowing how the device was damaged.

It would be beneficial to provide an aerosol-generating device with response procedures performed in response to a fall or shock that facilitate desirable functioning of the device, particularly when damaged. Also, it would be beneficial to provide response procedures that facilitate ease of locating the aerosol-generating device after a fall in case the device is lost. Further, it would be beneficial to provide response procedures that facilitate proper servicing of the aerosol-generating device in case the device is damaged.

Various aspects of the disclosure relate to detecting a fall or shock based on at least one acceleration value using a controller. Acceleration values may be provided to the controller by at least one accelerometer coupled to the aerosol-generating device.

Various aspects of the disclosure relate to response procedures initiated upon detecting a fall or shock. The response procedures include at least one of: initiating a mechanical change in the aerosol-generating device, initiating a modification to an external device interface, generating a human-perceptible beacon, storing data associated with the fall or shock in persistent or non-volatile memory, initiating a diagnostic routine, monitoring for a lost device condition, and initiating a soft shutdown or restart.

Various aspects of the disclosure relate to a non-transitory computer readable storage medium including a stored computer program that, when run on programmable electric circuitry, may cause the programmable electric circuitry to execute the at least one of the response procedures.

In one aspect of the disclosure, a method for use with an aerosol-generating device having a power source includes: receiving at least one acceleration value; detecting a fall or shock based on the at least one acceleration value; and initiating at least one response procedure after detecting the fall or shock. The at least one response procedure includes at least one of: initiating a mechanical change in the aerosol-generating device, initiating a modification to an external device interface, initiating a soft shutdown or restart, generating a human-perceptible beacon, monitoring for a lost device condition, storing data associated with the fall or shock in persistent or non-volatile memory, and initiating a diagnostic routine.

In another aspect of the disclosure, an aerosol-generating device includes a power source configured to operably couple to an aerosolizer to generate aerosol from an aerosol-generating substrate. The aerosol-generating device also includes at least one accelerometer configured to measure at least one acceleration value. The aerosol-generating device further includes a controller operably coupled to the power supply and the accelerometer. The controller includes a processor configured to perform a method of the disclosure.

In another aspect of the disclosure, a non-transitory computer readable storage medium includes a stored computer program that, when run on programmable electric circuitry, causes the programmable electric circuitry to execute a method of the disclosure.

In one or more aspects, the method includes detecting an end of the fall or shock based on the at least one acceleration value.

In one or more aspects, at least one of the response procedures is initiated before detecting the end of the fall or shock.

In one or more aspects, at least one of the response procedures is initiated after detecting the end of the fall or shock.

In one or more aspects, the mechanical change includes at least one of: sealing an aerosol-generating substrate container, unsealing a pressurized container, and electrically and mechanically isolating the power source.

In one or more aspects, the data associated with the fall or shock into persistent or non-volatile memory includes at least one of: a fall or shock, a timestamp, a maximum acceleration value, a fall duration, a fall height, an impact value, a diagnostic flag, a static motion duration, a fall count, and a device setting.

In one or more aspects, the method further comprises determining the difference between a fall or shock.

In one or more aspects, at least one of the response procedures is initiated in response to at least one of: a fall or shock, a fall duration exceeding a time threshold, a maximum acceleration value, a fall height exceeding a height threshold, and an impact value exceeding an impact threshold.

In one or more aspects, the at least one response procedure is initiated according to a priority sequence or a user preference.

In one or more aspects, initiating the diagnostic routine includes at least one of: performing the diagnostic routine after the end of the fall or shock, writing a flag into a persistent or non-volatile memory to perform the diagnostic routine after a next device start up, displaying a warning related to the fall or shock, and storing a fall or shock in a persistent or non-volatile memory.

In one or more aspects, the diagnostic routine includes checking a resistance value of an aerosolizer.

In one or more aspects, monitoring for the lost device condition includes: detecting a static position duration of the aerosol-generating device after detecting the fall or shock; and communicating a lost signal in response to the static position duration exceeding a lost time threshold.

In one or more aspects, initiating the modification to the external device interface includes stopping a charging routine between an external power source and the power source of the aerosol-generating device.

Advantageously, utilizing fall detection and related response procedures with an aerosol-generating device may facilitate protective management of electrical power, heat, data, or consumables before, during, or after the fall or shock. The response procedures may provide the user with information to help locate the aerosol-generating device after the fall or shock, even when the user is not yet aware that the aerosol-generating device has been lost. The response procedures may also facilitate customer care of a damaged aerosol-generating device by understanding how the device was damaged. Other benefits will become apparent to one skilled in the art having the benefit of this disclosure.

All scientific and technical terms used herein have meanings commonly used in the art unless otherwise specified. The definitions provided herein are to facilitate understanding of certain terms used frequently herein.

The term "aerosol-generating device" refers to a device configured to use an aerosol-generating substrate to generate aerosol. Preferably, the aerosol-generating device also includes an aerosolizer, such as an atomizer, cartomizer, or heater.

The term "aerosol-generating substrate" refers to a device or substrate that releases, upon heating, volatile compounds that may form an aerosol to be inhaled by a user. Suitable aerosol-generating substrates may include plant-based material. For example, the aerosol-generating substrate may include tobacco or a tobacco-containing material containing volatile tobacco flavor compounds, which are released from the aerosol-generating substrate upon heating. In addition, or alternatively, an aerosol-generating substrate may include a non-tobacco containing material. The aerosol-generating substrate may include homogenized plant-based material. The aerosol-generating substrate may include at least one aerosol former. The aerosol-generating substrate may include other additives and ingredients such as flavorants. Preferably, the aerosol-generating substrate is a liquid at room temperature. For example, the aerosol forming substrate may be a liquid solution, suspension, dispersion or the like. In some preferred embodiments, the aerosol-generating substrate includes glycerol, propylene glycol, water, nicotine and, optionally, one or more flavorants. Preferably, the aerosol-generating substrate includes nicotine.

The term "tobacco material" refers to a material or substance including tobacco, which includes tobacco blends or flavored tobacco, for example.

The term "cartomizer" refers to a combination of cartridge and atomizer that is part of an electronic cigarette.

The term "fall" or "falling" maybe used herein to refer to a state of an object in which gravity is acting on the object and causing a change in acceleration toward the gravitational center of the Earth. The acceleration caused by gravity is 1G toward the gravitational center. 1G on the Earth is about 9.8 $m/s^2$ toward the gravitational center of the Earth.

The term "free fall" or "free falling" may be used herein to refer to a state of an object in which the object is falling due to gravity without any other significant force changing the acceleration of the object. The object in a free fall status on the Earth may fall toward the gravitational center of the Earth.

The term "shock" refers to a sudden acceleration or deceleration of an object and may be described as a transient physical excitation. A shock may follow a fall, for example, when the object impacts the ground. The difference between a shock and a fall, or free fall, may be determined based on detecting the sudden acceleration or deceleration.

The term "impact" refers to the result of an object upon colliding with another object, such as the ground. Impact may be described in terms of acceleration, deceleration, force, or other effects due to the collision.

The term "accelerometer" refers to any suitable device that measures proper acceleration, which may be described as the acceleration relative to free fall or the acceleration experienced by people or objects.

The term "initiating" refers to the action of starting a process. The process may include multiple actions. For example, a process of opening of a seal, or unsealing, may be initiated by a controller, which sends a command or signal to an actuator, which physically carries out the opening of the seal. Some or all the actions of a process may be carried out by the component that initiates the process. For example, the actuator may be considered part of the controller, which carries out all actions of opening the seal.

Having defined certain frequently-used terms above, the response procedures of the present disclosure will be described herein in more detail. In general, the response procedures may be initiated by an aerosol-generating device in response to detecting a fall or shock. The procedures may be initiated at various times, such as before, during, or after, detecting the fall or shock.

The aerosol-generating device may include various components to facilitate use as an aerosol-generating device and to carry out the response procedures. For example, the aerosol-generating device may include at least one of: a housing, an accelerometer, a controller, a power source, an external device interface, an actuator, a communication interface, a pressurized container, a display, a speaker, a switch, a puff sensor, an aerosolizer, and an aerosol-generating substrate. Certain components may be included to contribute to the generation of aerosol during typical use, such as one or more of: the controller, the power source, the external device interface, the switch, the puff sensor, the aerosolizer, and the aerosol-generating substrate. Certain components may be included to contribute to carrying out the response procedures, such as one or more of: the accelerometer, the controller, the power source, the actuator, the communication interface, the display, and the speaker.

The aerosol-generating device may be charged or recharged. The power source may be portable so that the aerosol-generating device may be used in various locations. A specifically designed charger may operably couple to the aerosol-generating device to charge the portable power source of the aerosol-generating device. The aerosol-device charger may include another portable power source, which may store electrical energy for charging the portable power source of the aerosol-generating device when operably coupled. The charger may be connected to a non-portable power source, such as a wall outlet, to recharge at least one of the portable power sources.

The aerosol-device charger may be external to the aerosol-generating device and removably couplable to the aerosol-generating device. For example, the aerosol-generating device may include an external device interface, which may include a charging interface, that may operably couple to an interface of the charger. The charger may be portable, such that the user may hold and transport the aerosol-generating device coupled to the charger. One example of a charger is the IQOS charger sold by Philip Morris Products SA (Neuchâtel, Switzerland).

The housing may be used to contain components of the aerosol-generating device. Some components may couple to the housing. The housing may provide a size and shape suitable for being held by the hands of a user and for being puffed by the mouth of the user. The housing may be integrally formed in one portion or may be removably coupled together as multiple portions.

The aerosol-generating device may include a controller portion and a consumable portion. The housing may be divided between the controller portion and the consumable portion. In general, the controller portion may include components that are not intended to be replaced, and the consumable portion may include components that are intended to be replaced over the useful live of the aerosol-generating device. For example, the controller portion may include the switch, the puff sensor, at least part of the aerosolizer, the accelerometer, the controller, the power source, the actuator, the communication interface, the display, or the speaker. The consumable portion, for example, may include the aerosol-generating substrate or part of the aerosolizer. The controller and consumable portions may be permanently or removably coupled together. The consumable portion may be replaced in its entirety, or various components of the consumable portion may be removed and replaced. The consumable portion may also be described as a mouth portion and may include a mouthpiece to facilitate ease of puffing by the user.

The aerosol-generating substrate may take any suitable form. For example, the substrate may be solid or liquid. The substrate may be contained in a substrate housing or cartridge, which may be coupled to the consumable portion of the housing. The aerosolizer may be operably coupled to the aerosol-generating substrate to generate aerosol when activated.

The aerosolizer may be coupled to the housing of the aerosol-generating device. Part or all the aerosolizer may be coupled to the consumable portion of the housing. Part or all the aerosolizer may be coupled to the controller portion of the housing.

The aerosolizer may utilize any suitable technique for generating aerosol from the aerosol-generating substrate. In some cases, the aerosolizer may be thermally or fluidly coupled to the aerosol-generating substrate. The aerosolizer may be compatible for use with various types of aerosol-generating substrates.

The aerosolizer may include a heating blade for use with a solid aerosol-generating substrate. The heating blade may be coupled to the controller portion of the housing to receive electrical power from the power source and may be removably coupled to the consumable portion. For example, to generate aerosol, the substrate may be provided in the form of a heat stick including the solid substrate. The heating blade may be inserted into the heat stick and heated to produce aerosol from the solid substrate. The solid substrate may be a smoking material, such as tobacco. The heat provided by the heating blade to the heat stick may not burn the smoking material.

The aerosolizer may include a heater, a heater coil, a chemical heat source (such as a carbon heat source), or any suitable means that heats the substrate to generate aerosol. The aerosolizer may be coupled to the controller portion of the housing to receive electrical power from the power source and may be disposed adjacent to the substrate. For example, the aerosolizer may be provided in the form of a heater, and the substrate may be contained in the substrate housing. A heating element of the heater may be disposed adjacent to the substrate housing and heated to produce aerosol from a liquid or solid substrate. Part of the aerosolizer may also be coupled to the consumable portion of the housing. For example, a heater coil may include a susceptor coupled to the consumable portion and an inductive coil coupled to the controller portion configured to transfer energy to the susceptor for heating the substrate.

The aerosolizer may include an atomizer. A liquid aerosol-generating substrate may be contained in the substrate housing and in fluid communication with the atomizer. The atomizer may mechanically generate aerosol from the liquid substrate, which does not need to rely on temperature.

The aerosolizer may be compatible for use with an aerosol-generating substrate having a nicotine source and a lactic acid source. The nicotine source may include a sorption element, such as a polytetrafluoroethylene (PTFE) wick with nicotine adsorbed thereon, which may be inserted into a chamber forming a first compartment. The lactic acid source may include a sorption element, such as a PTFE wick, with lactic acid adsorbed thereon, which may be inserted into a chamber forming a second compartment. The aerosolizer may include a heater to heat both the nicotine source and the lactic acid source. Then, the nicotine vapor may react with the lactic acid vapor in the gas phase to form an aerosol.

The aerosolizer may be compatible for use with an aerosol-generating substrate having a capsule that contains nicotine particles and disposed in a cavity. During a user's inhalation, the air flow may rotate the capsule. The rotation may suspend and aerosolize the nicotine particles.

The switch may be coupled to the controller portion of the housing. The switch may be disposed in or on the housing to be accessible by the user. The switch may utilize any suitable mechanism to receive input from the user. For example, the switch may include a button or lever. In response to being pressed, toggled, or otherwise manipulated by the user, the switch may be activated or deactivated.

The switch may be associated with one or more functions. In particular, engagement of the switch may initiate various functionality of the aerosol-generating device. For example, the aerosolizer may be activated in response to engagement of the switch. The switch may be engaged to power on (for example, activate) and released to power off (for example, deactivate) the aerosolizer or other components.

In addition, or as an alternative to, the switch, a puff sensor may be operably coupled to the aerosolizer to activate the aerosolizer. The puff sensor may be operably coupled to a controller of the aerosol-generating device. The puff sensor may detect an inhalation by the user on the mouthpiece of the consumable portion. The puff sensor may be positioned within an airflow channel in the aerosol-generating device to detect when a user inhales, or puffs, on the device. The puff may be detected by the controller using the puff sensor. Non-limiting types of puff sensors may include one or more of a vibrating membrane, a piezoelectric sensor, a mesh-like membrane, a pressure sensor (for example, a capacitive pressure sensor), and an airflow switch.

The switch may be described as part of a user interface of the aerosol-generating device. The user interface may include any components that interact with any one of the user's senses, such as touch, sight, sound, taste, or smell.

The speaker may also be described as part of the user interface. The speaker may be coupled to the controller portion of the housing. The speaker may be disposed in or on the housing such that audio generated by the speaker can be heard by the user. The speaker may be any size and type suitable for generating sound for a portable aerosol-generating device. The speaker may be simple and include a buzzer to produce one or more tones. The speaker may have higher fidelity than the buzzer and be capable of providing voice sounds or even music sounds.

The display may also be described as part of the user interface. The display may be coupled to the controller portion of the housing. The display may be disposed in or on the housing such that the display is visible to the user. The display may be any size and type suitable for displaying visuals on a portable aerosol-generating device. The display may be simple and include a single light source, such as a light-emitting diode, to produce one or more pixels, or one or more colours. The display may have higher resolution than a single light source and may be able to display images.

The aerosol-generating device may include a pressurized container. A pressurized container be a cartridge filled with a ready-to-vape aerosol under pressure or a liquid under pressure to heat in order to generate an aerosol. The pressurized container may be used to extend the storage capacity of the cartridge and offer a more inhalation experience. This pressurized container can be assimilated to an air bottle, similar to those, used in scuba diving or an asthma inhaler.

The external device interface of the aerosol-generating device may include the communication interface. The communication interface may be coupled to the controller portion of the housing. The communication interface may be disposed in or on the housing.

The communication interface may be operably coupled other devices and used to transfer data over a wired or wireless connection. The communication interface may connect to one or more networks. For example, the communication interface may connect to a low-power wide area network (LPWAN), such as those using technology from the Sigfox company or the LoRa Alliance organization.

The communication interface may operably couple to a remote user device. For example, the remote user device may be a smart phone, a tablet, or other device remote to the aerosol-generating device. The remote user device may include its own communication interface to connect to the aerosol-generating device. The communication interface of the aerosol-generating device may connect to the Internet directly or indirectly through a remote user device (for example, a smartphone) or through a network, such as the LPWAN.

The communication interface may include an antenna for wireless communication. A wireless communication interface may utilize a Bluetooth protocol, such as Bluetooth Low Energy. The communication interface may include a mini Universal Serial Bus (mini USB) port for wired communication. A wired communication interface may also be used as a power connection for charging.

The external device interface may include the charging interface, which may be integrated with or separate from a wired communication interface, operably coupled to the power source to recharge the power source. The power source may be coupled to the controller portion of the housing. The power source may be disposed in or on the housing. The power source may be removably coupled to the housing (intended to be replaced) or permanently coupled (intended to not be replaced).

The power source may provide power to various components. The power source may be operably coupled to at least the aerosolizer. The power source may be operably coupled to the aerosolizer using the controller.

The power source may be a battery. The battery may be disposable or rechargeable.

The aerosol-generating device may include at least one accelerometer. The accelerometer may be coupled to the controller portion of the housing. The accelerometer may be disposed in or on the housing. The accelerometer may be any size and type suitable for detecting acceleration in an aerosol-generating device. The accelerometer may measure at least one acceleration value. In general, the accelerometer may provide one or more measured acceleration values that describe any acceleration force applied to the aerosol-generating device.

The accelerometer may be a 3-axis accelerometer, which may be used to measure 3 different acceleration values, one for each axis. Each axis may be orthogonal to the other axes. Acceleration values measured by the accelerometer may be normalised and represented by a single value. For example, the normalised acceleration value $A_N$ may be equal to the square root of the sum of the square of the individual acceleration values. When using a 3-axis accelerometer, the normalised acceleration value may be calculated according to Equation 1.

$$A_N = \sqrt{A_X^2 + A_Y^2 + A_Z^2} \tag{1}$$

where $A_N$ is the normalised acceleration value, $A_X$ is the acceleration value along a first axis (x-axis), $A_Y$ is the acceleration value along a second axis orthogonal to the first axis (y-axis), and $A_Z$ is the acceleration value along a third axis orthogonal to the first and second axes (z-axis). The accelerometer may report or provide the individual acceleration values and may optionally provide the normalised acceleration value.

In general, a greater magnitude of acceleration value may mean a greater acceleration applied to the device. When the device is not moving relative to the Earth, which may be described as the device being in a static position, the only acceleration exerted on the device may be Earth's gravity. For example, the user may be holding or storing the device in a manner that resists movement of the device due to gravity. When static, the normalised acceleration value may equal about 1G. A force greater than Earth's gravity may result in an individual or normalised acceleration value greater than about 1G.

During free fall, the individual and normalised acceleration values may be analysed to determine various fall characteristics. For example, the normalised acceleration value may about 0G, during free fall. Thus, free fall may be detected when the normalised acceleration value equals about 0G.

An end of the free fall may occur when the device lands. The end of the free fall may be marked by deceleration of the device (for example, acceleration opposite the force of gravity), so the normalised acceleration value may transition from 0G to a non-zero G in a short amount of time at the end of the fall. This deceleration may be described as a shock. For example, the normalised acceleration value may have a sudden variation when the device impacts the ground. For example, the normalised value may change from 0 to 1 within less than 1 second. The end of the shock may be marked by the device returning to a static position, in which the normalised acceleration value equals about 1.

Although some shocks may occur at the end of a fall, not all falls may end with a shock and not all shocks may begin with a fall. For example, a device held by a user may be bumped and jarred into motion causing a shock without a fall. As another example, a device may fall and be caught by the user or land softly without a sudden change in acceleration causing a fall without a shock.

If a device were thrown, acceleration values in the horizontal or vertical direction may increase as the device is being thrown, but after the device begins to fall in a free fall state, the acceleration values in the horizontal or vertical direction may equal about 0G. This may hold true even when the device is thrown with great force such that the normalised acceleration value exceeds 1G before the device is released and eventually the normalized acceleration may equal to about 0G after the device begins to fall in a free fall state.

The controller may be operably coupled to the accelerometer to receive at least one acceleration value, such as an individualized acceleration value or a normalised acceleration value. The controller may be coupled to the controller portion of the housing. The controller may be disposed in or on the housing. The controller may be coupled to other components as well, such as the power source, the aerosolizer, the actuator, the switch, the display, the speaker, the puff sensor, or the communication interface.

The controller may be used to determine whether the fall or shock is detected. The controller may be used to determine when to initiate the response procedures. In particular, the controller of the aerosol-generating device may include a processor and a memory. For example, the processor may include programmable electric circuitry capable of running a computer program. The functionality of the controller may be implemented in firmware. At least one response procedure may be stored in a non-transitory computer readable storage medium, such as the memory, and initiated by the processor in response to the processor detecting the fall or shock. The response procedures may be stored in memory as a computer program. The computer program may control one or more components of the aerosol-generating device, such as one or more actuators.

In some cases, the controller may be described as including the accelerometer. The accelerometer may be integral with the processor of the controller. For example, the processor and the accelerometer may be formed on the same chip or in the same integrated circuit. However, the processor may be a separate component coupled to the accelerometer.

To receive acceleration values, the controller may use a sampling rate or frequency for measuring and determining acceleration values. One sample may be taken for each cycle of the sampling rate or frequency. One sample may correspond to one set of measurements. For example, the controller may take measurements of individual acceleration values using at least one accelerometer at the sampling rate and may determine the normalised acceleration value in response to each set of measurements. One normalised acceleration value may be determined for each set of measurements, or sample.

The sampling rate may be constant, or uniform, over time. However, the sampling rate need not be uniform in time and may be adjusted depending on the needs of the device. A faster sampling rate may reduce the amount of time needed to detect a fall or shock. However, the faster sampling rate may also reduce the time available until the next charging (for example, battery life). Values, or data, corresponding to each sample or set of measurements may be stored in memory. The stored values may be used by the processor to determine characteristics of the free fall or shock.

Various types of memory may be used in the controller. The memory may include volatile memory. Volatile memory may be used to store data for use by the processor while the memory is powered up (turned on). The data may be lost when the volatile memory is powered down (turned off). Any type of volatile memory suitable for use in a portable aerosol-generating device may be used. For example, the volatile memory may include static or dynamic random-access memory (SRAM or DRAM).

The memory of the controller may include non-volatile memory (e.g., persistent memory). Non-volatile memory may be used to store data for use by the processor even after the memory has been powered down and powered up again. Any type of non-volatile memory suitable for use in a portable aerosol-generating device may be used. For example, the non-volatile memory may include non-volatile random-access memory (NV-RAM) or electrically erasable programmable read-only memory (EEP-ROM). Using persistent memory or non-volatile memory, may allow stored data to be available to the processor, even after a diagnostic routine, or diagnostic test, is completed or after the aerosol-generating device is reset.

The sampling rate may be selected to allow the processor to determine that the device is falling before the end of a typical fall that may cause damage to the device. A free fall may be detected once the normalised acceleration value drops below a threshold value. One technique for detecting free fall may use only one sample. For example, the sampling rate may be about 100 Hz, which means a sample is taken once every 0.01 seconds. The free fall may be detected at the sample after the device begins to fall, which is a maximum of 0.01 seconds after the start of the fall. According to Equation 2, the device may fall a maximum distance D of 0.5 millimetres in free fall before the one sample is taken that may be used to determine that the device is in free fall.

$$D(\text{metres})=\tfrac{1}{2}*1G*t(\text{seconds})^2 \tag{2}$$

Here, 1G on the Earth is about 9.8 m/s$^2$. Some additional calculation time, which may be at least an order of magnitude smaller than the time between samples, may be required before the processor can determine that the device is undergoing free fall. The threshold value may be any value suitable for a portable aerosol-generating device. The threshold value may be selected to balance minimizing falsely identification of a fall or shock during typical use and robustly detecting potentially damaging falls. The threshold value may be greater than or equal to about 0, about 0.1, about 0.2, about 0.3, about 0.4, about 0.5, about 0.6, about 0.7, about 0.8, or even about 0.9. The threshold value may be less than about 1.

A free fall may be detected by the processor using one or more samples. One technique for detecting free fall may use more than one sample, or a plurality of samples. When a device is hold by a user's hand being waved, the acceleration may fluctuate. Due to the changing accelerations caused by the movement of the device, using more than one sample may provide more robust free fall detection compared to a single sample.

In one example of detecting free fall, the sampling rate may be about 50 Hz, and the free fall may detect 20 samples after the device begins to fall, which is a maximum of 0.40 seconds after the start of the fall. According to Equation 2, the device may fall a maximum distance D of 196 millimetres in free fall before the 20 samples are taken that may be used to determine that the device is in free fall. For example, if the device detects 0G for consecutive 20 samples, the device may determine that free fall is happening. Some additional calculation time, which may be at least an order of magnitude smaller than the time between samples, may be required before the processor can determine that the device is undergoing free fall. The sample rate may be increased, for example increased to about 100 Hz or about 200 Hz, if the first detected sample exceeds 1G significantly due to additional force provided by a user's hand, for example, exceeds 7G. This may allow the device to determine a free fall before the device reaches to the floor. The number of samples may be reduced, for example reduced to 10 samples, if the first detected sample exceeds 1G significantly. On the other hand, the sampling rate may be reduced, for example reduced to 10 Hz if the first detected sample is equal to about 1G. The number of samples may be reduced, for example reduced to 10, if the first detected sample exceeds 1G significantly.

The shock at the end of a fall may be detected using a change in acceleration value over time. After detecting a fall has happened, the shock may be detected using at least two samples. A slope between the samples related to acceleration value versus time may be calculated. For example, using the 100 Hz sample rate, a sample may have a normalised acceleration value equal to about 0, and the subsequent second sample taken 0.01 seconds later may have a normalised acceleration value equal to about 1. The change in acceleration value over time, or slope, is equal to about 100. The processor may determine that a shock has happened when this exceeds a threshold change value or threshold slope. The threshold slope may be less than or equal to about 100, about 90, about 80, about 70, about 60, about 50, about 40, about 30, about 20, about 10, about 9, about 8, about 7, about 6, about 5, about 4, about 3, about 2, or even about 1. The threshold slope may be greater than or equal to about 1, about 2, about 3, about 4, about 5, about 6, about 7, about 8, about 9, about 10, about 20, about 30, about 40, about 50, about 60, about 70, about 80, about 90, or even about 100.

Before detecting the fall or shock, the controller may receive and temporarily store acceleration values, which may be used to determine the start of a fall or shock. In one example, the shock may be determined based on a sudden variation in the acceleration values. Once the shock is detected, some historical data before the shock may be analysed to determine characteristics of the fall, such as fall duration and fall height, and may be used to determine when the start of the fall occurred. For other types of shock, for example, without a fall, the historical data may not be utilized.

The processor may initiate at least one response procedure after detecting the fall or shock. Different moments related to the fall or shock may be detected and used as a trigger to initiate the response procedures. Detecting the fall or shock includes detecting the start of the fall, detecting the end of the fall, detecting the start of the shock, or after detecting the end of the shock. For example, some response procedures may be initiated immediately after detecting the start of the fall to prevent damage before the device impacts the ground. Some response procedures may be initiated only after detecting the end of the shock to diagnose damage after the device impacts the ground. For example, the end of the shock may be determined response to the normalised acceleration value being equal to about 1 to indicate a static position.

One or more of the actuators may be coupled to the housing. The actuator may be disposed in or on the housing. In general, the actuator may be operably coupled to at least one component of the aerosol-generating device to effect a mechanical change in the component. The actuator may be operably coupled to the controller to receive commands, or signals, to effect the mechanical change. For example, the actuator may seal or unseal the substrate container of aerosol-generating substrate. The actuator may seal or unseal the pressurized container. The actuator may isolate the power source. In particular, the actuator may electrically and mechanically isolate the power source. For example, the electrical and mechanical isolation of the power source may require the user to manually electrically reconnect the power source to other components of the aerosol-generating device. The aerosol-generating device may not power on any components until reconnection.

One or more of the components, such as controllers, accelerometers, or sensors, described herein may include a processor, such as a central processing unit (CPU), computer, logic array, or other device capable of directing data coming into or out of the aerosol-generating device. The controller may include one or more computing devices having memory, processing, and communication hardware. The controller may include circuitry used to couple various components of the controller together or with other components operably coupled to the controller. The functions of the controller may be performed by hardware and/or as computer instructions on a non-transient computer readable storage medium.

The processor of the controller may include any one or more of a microprocessor, a microcontroller, a digital signal processor (DSP), an application specific integrated circuit (ASIC), a field-programmable gate array (FPGA), and/or equivalent discrete or integrated logic circuitry. In some examples, the processor may include multiple components, such as any combination of one or more microprocessors, one or more controllers, one or more DSPs, one or more ASICs, and/or one or more FPGAs, as well as other discrete or integrated logic circuitry. The functions attributed to the controller or processor herein may be embodied as software, firmware, hardware, or any combination thereof. While described herein as a processor-based system, an alternative controller could utilize other components such as relays and timers to achieve the desired results, either alone or in combination with a microprocessor-based system.

In one or more embodiments, the exemplary systems, methods, and interfaces may be implemented using one or more computer programs using a computing apparatus, which may include one or more processors and/or memory. Program code and/or logic described herein may be applied to input data/information to perform functionality described herein and generate desired output data/information. The output data/information may be applied as an input to one or more other devices and/or methods as described herein or as would be applied in a known fashion. In view of the above, it will be readily apparent that the controller functionality as described herein may be implemented in any manner known to one skilled in the art.

The response procedures may be initiated in response to one or more parameters. For example, at least one response procedure may be initiated in response to at least one of: detecting the fall or shock, determining that a fall duration exceeds a time threshold, determining a fall height that exceeds a height threshold, or determining an impact value that exceeds an impact threshold. The fall height may be calculated as the fall distance described in Equation 2. The two parameters of time and fall height may be related to the impact value. A greater the fall duration or the fall height may be used to predict a greater impact value. A greater impact value may result in more damage, or different types of damage, to the device. Certain response procedures may be more useful to initiate in response to certain thresholds being exceeded or not exceeded. In one example, electrically and mechanically isolating the power source may be initiated in response to determining that the fall duration exceeds a time threshold or that a fall height exceeds a height threshold. As another example, certain diagnostic procedures may be initiated if certain thresholds are exceeded, such as the impact threshold.

The response procedures may be initiated according to a priority sequence, which may be adjusted by a user preference. The priority sequence may, for example, place response procedures that may directly protect the device from damage at a higher priority than other types of response procedures. Non-limiting examples of response procedures that may directly protect the device from damage include: sealing the substrate container, unsealing the pressurized container, or isolating the power source. The user preference may indicate which response procedures the user wants to be executed in response to detecting the fall or shock. The user preference may be adjusted by the user or automatically according to the user profile or history. The priority sequence or the user preference may include one, some, or all response procedures to be initiated in response to the fall or shock.

The response procedures may include various actions initiated by the processor. For example, the response procedures may include at least one of: initiating a mechanical change in the aerosol-generating device, initiating a modification to an external device interface, initiating a soft shutdown or restart, generating a human-perceptible beacon, monitoring for a lost device condition, storing data associated with the fall or shock in persistent or non-volatile memory, determining a fall or shock, or initiating a diagnostic routine.

Some response procedures may be particularly suitable for initiating before the end of the fall or shock, whereas some may be particularly suitable after the end of the fall or shock. Non-limiting examples of response procedures that may be particularly suitable for initiating before the end of the fall or shock include: initiating a mechanical change in the aerosol-generating device, initiating a diagnostic routine, storing data associated with the fall or shock in persistent or non-volatile memory, or initiating a soft shutdown or restart. Non-limiting examples of response procedures that may be particularly suitable for initiating after detecting the end of the fall or shock include: generating a human-perceptible beacon, initiating a diagnostic routine, storing data associated with the fall or shock in persistent or non-volatile memory, or monitoring for a lost device condition.

Some of the response procedures may be particularly suitable for initiating in response to a shock by itself, without a fall. Non-limiting examples of response procedures that may be particularly suitable for a shock without a fall include initiating a diagnostic routine, storing data associated with the shock in persistent or non-volatile memory, or initiating a soft shutdown or restart.

Initiating a mechanical change in the aerosol-generating device may mechanically or physically alter at least one component of the device. The change may be initiated after detecting the fall. In particular, the change may be initiated after detecting the start of the fall so that the mechanical change may be completed before the end of the fall. For example, initiating a mechanical change in the aerosol-generating device may include: sealing the substrate container, unsealing the pressurized container, or isolating the power source.

In one example, sealing the substrate container may seal a nicotine liquid tank. This response procedure may be especially useful when the aerosol-generating substrate is an electronic cigarette liquid (e-liquid). The controller may initiate sealing the substrate container by sending a command or signal to an actuator operably coupled to close a valve in fluid communication with the nicotine liquid tank to close the e-liquid opening. Sealing may help protect the device from damage due to the shock after the fall. For example, closing the e-liquid opening may prevent e-liquid leakage inside the device due after the fall ends.

In another example, unsealing the pressurized container may be used to empty containers with pressurized contents, particularly before the end of the fall. The pressurized container may be used to store more liquid compared to a non-pressurized container or cartridge, which may provide extended life usage. The pressurized container may also be used to store pressurized aerosol. The controller may initiate unsealing the pressurized container by sending a command or signal to an actuator operably coupled to open a valve in fluid communication with the pressurized container to close the container opening. Sealing may help protect the device from damage due to the shock after the fall. For example, the impact associated with the shock may deform the container (for example, elastically or plastically), which may suddenly decrease volume in a manner that causes a spike in pressure inside the container that breaks the container. The pressurized break of the container may cause damage to other components and may cause leakage from the container. Unsealing the pressurized container before the fall ends may prevent pressure spikes that result in such breakage and leakage.

In yet another example, isolating the power source may include electrically and mechanically isolating the power source from the rest of the electronic circuit. The controller may initiate isolation of the power source by sending a command or signal to an actuator operably coupled between the power source and at least one other component of the device to physically break the electrical connection to the power source. Isolating the power source may prevent electrical damage caused by impact with the ground. For example, a welding or component may break or move and cause a short-circuit due to the shock after the fall. Removing electrical power may prevent electrical damage to components due to the short circuit. This response procedure may be prioritized after other response procedures. Disconnecting the power source electrically and mechanically may power down the controller or memory, which may stop writing into memory of data that would be desirable to store and may prevent the accelerometer from working. In some cases, isolating the power source may be the lowest priority response procedure in the priority sequence. Also, isolating the power source may not be initiated if the predicted impact is less than a certain threshold. The extent of the impact may be predicted, for example, based on fall duration or fall height.

Initiating a modification to an external device interface may alter an operable coupling between the device and another device. The modification may be initiated after detecting the fall. In particular, the modification may be initiated after detecting the start of the fall so that the modification may be completed before the end of the fall. In one example, initiating a modification to an external device interface may stop a charging routine between an external power source and the power source of the aerosol-generating device. The external power source may be the aerosol-device charger that may be used to charge the power source of the aerosol-generating device. This response procedure may be especially useful when the aerosol-generating device and the aerosol-device charger are susceptible to dropping, for example, when both are portable. Stopping the charging routine may include isolating the power sources, for example, electrically and optionally mechanically isolating the power sources from one another or other components. Stopping the charging routine may prevent electrical damage to some components due to a short circuit.

Initiating a soft shutdown or restart may alter the operational state of the device. The controller may initiate a soft shutdown or restart after detecting the fall or shock. A soft shutdown may remove power from the device very quickly. A soft shutdown may store certain parameters to non-volatile or persistent memory before removing power. In a soft shutdown, some components may not be powered down, such as the memory. In one example, the soft shutdown may be initiated after detecting the start of the fall so that the shutdown may be completed before the end of the fall. The soft shutdown may prevent electrical damage to some components due to a short circuit. When initiated with other response procedures, the soft shutdown may have a lower priority because, after the shutdown, some components may be powered down and may no longer function, such as the controller or actuator.

A restart may include a soft shutdown, in which some or all components are powered down, and a restoration of power to some or all components after a period of time. For example, the power may be restored after a short time (e.g., up to a few seconds). Using a restart may conveniently return the device to normal operation automatically after the end of a fall so that the user does not need to manually turn on the device.

Generating a human-perceptible beacon may provide an alert to the user to facilitate locating the device. The human-perceptible beacon may be initiated after detecting the fall or shock. The beacon may be perceived using at least one human sense in a manner that guides the user toward the device. For example, the human-perceptible beacon includes an audible beacon, such as the sound of a buzzer from the speaker. The sound of the buzzer may be louder the closer the user is to the device. This response procedure may be especially useful when the user may have lost the device after the fall, particularly when the user cannot see the device. This may help prevent losing the device. In one example, the controller may initiate generating the human-perceptible beacon after detecting the end of the fall or shock when the device may be in a static position. The device may be static for a certain period of time before the human-perceptible beacon is initiated. In another example, the controller may initiate generating the human-perceptible beacon after detecting the start of the fall or shock to alert the user that the device is falling or has experienced a shock.

Monitoring for a lost device condition may be used to determine whether additional actions may be taken to alert the user that the device may be lost. This response procedure may be especially useful when the human-perceptible beacon is not used or when, after the human-perceptible beacon is used, the device remains in a static position for an extended period of time.

When the device is in a static position for an extended time period after a fall, the likelihood may be higher that the user is no longer in the vicinity. In one example, the controller may detect a static position duration of the device, which may be based on at least one accelerometer value, beyond a lost time threshold after the end of the fall or shock.

Monitoring for the lost device condition may include performing certain actions in response to the static position duration. In one example, a lost signal may be communicated to the user. The device may be operably coupled to another device of the user, such as the remote user device. In particular, the aerosol-generating device may be operably coupled to an LPWAN using the communication interface. A lost signal may be communicated over the LPWAN to a server indicting that the aerosol-generating device is likely to be lost. The server may send a message to the user that the device is likely to be lost and may provide an estimation of the location where the device was lost. The estimated location may be sent to the user, for example, to the user's smartphone, which may be used to display the estimated location of the device.

Storing data associated with the fall or shock in persistent or non-volatile memory may facilitate continued operation of the device after the fall or shock. The data may be stored after the start or the end of the fall or shock. In one example, storing data may be one part of preparing the firmware of the controller for the shock at the end of the fall. This response procedure may be especially useful when the user wants to resume using the device after the fall with minimal interruption because the current state of operation may be stored. Further, this response procedure may be especially useful in diagnosing the nature of the damage based on stored data about the fall or shock. Data may include any useful information. Non-limiting types of data include: a fall or shock, a timestamp of a moment of the fall or shock, a maximum acceleration value, a fall duration, a fall height, an impact value, a diagnostic flag, a static motion duration, a fall count, or a device setting. The type of fall or shock may be determined by the controller based on one or more accelerometer values. The type of fall or shock may include, for example, a free fall or a shock (without a fall). The difference between a fall or shock may be determined to determine the type. The maximum acceleration value, such as a maximum of the normalised acceleration value, may be measured before or after the start of the fall or shock. The impact value may indicate the extent of the impact, for example, in terms of force of impact, change in acceleration or deceleration, or the potential consequences of the impact (for example, damage). The diagnostic flag may be enabled, for example, when the fall duration, fall height, or impact exceed certain thresholds. The fall count may store the number of falls over the life of the device. The device setting may indicate the last operating configuration of the device before the fall or shock.

Certain data may be particularly useful in diagnosing the damage caused by the fall or shock. The diagnosis may be useful in facilitating proper repair of the device by customer care. Customer care may review the fall count to determine whether the device may have been subject to previous damage or whether the device is likely to be repairable or eligible for warranty repair. Customer care may also encourage the user to take better care of the device if the fall count is high or exceeds a threshold. Determining a fall or shock may also be useful for customer care to determine whether the device is likely to be repairable or eligible for warranty coverage. For example, a projectile free fall may not be eligible for a warranty repair, particularly if the maximum acceleration value before the start of the fall indicates that the device was thrown with great force.

Initiating a diagnostic routine may provide the device with an accounting of the extent of damage. This response procedure may be especially helpful when damage may not be externally visible to the user but may be captured using the diagnostic routine initiated by the controller. The diagnostic routine may include checking a resistance value of the aerosolizer. For example, if the aerosolizer includes a heating blade, the overall resistance of the blade may be measured as an indication of its integrity. A higher than expected resistance may mean that the heating blade is broken. If the aerosol-generating substrate includes an e-liquid, the resistance of a heating element, such as a heating mesh, of the aerosolizer may be measured. A lower than expected resistance may mean that the e-liquid has leaked onto the mesh. In response, the controller may prevent normal operation of the device or warn the user to prevent unnecessary contact with the e-liquid. A higher resistance may mean that the mesh is broken. Other diagnostics that may be performed include a diagnostic of the battery circuit, a diagnostic of the pressure sensor element, or a diagnostic of the charging element.

Non-limiting examples of initiating the diagnostic routine include: performing the diagnostic routine after the end of the fall or shock, writing a flag into a persistent or non-volatile memory to perform the diagnostic routine after a next device start up, displaying a warning related to the fall or shock, and storing the fall or shock in the persistent or non-volatile memory. In one example, the diagnostic routine may be performed only after the fall or shock has ended when the fall duration, fall height, or impact are above a certain threshold. In another example, writing or enabling a flag in a persistent or non-volatile memory may cause the controller to initiate full diagnostics, or self-tests, to verify whether the device is damaged when the device next starts up. This response procedure may be accompanied by an automatic soft shutdown or restart of the device. However, the device need not automatically shut down or restart to use the flag. The flag may cause the device to enter a progressive start up to check different components of the device as the components are powered on. In a further example, displaying the warning related to the fall or shock may provide a report to the user and may encourage the user to take better care of the device. The warning may also be related to the results of the diagnostic routine. In yet another example, storing the fall or shock in the persistent or non-volatile memory may be used in a diagnostic routine performed by customer care.

The response procedures for the aerosol-generating device may be understood with reference to one or more drawings. The schematic drawings are not necessarily to scale and are presented for purposes of illustration and not limitation. The drawings depict one or more aspects described in this disclosure. However, it will be understood that other aspects not depicted in the drawing fall within the scope of this disclosure.

Figure 1:
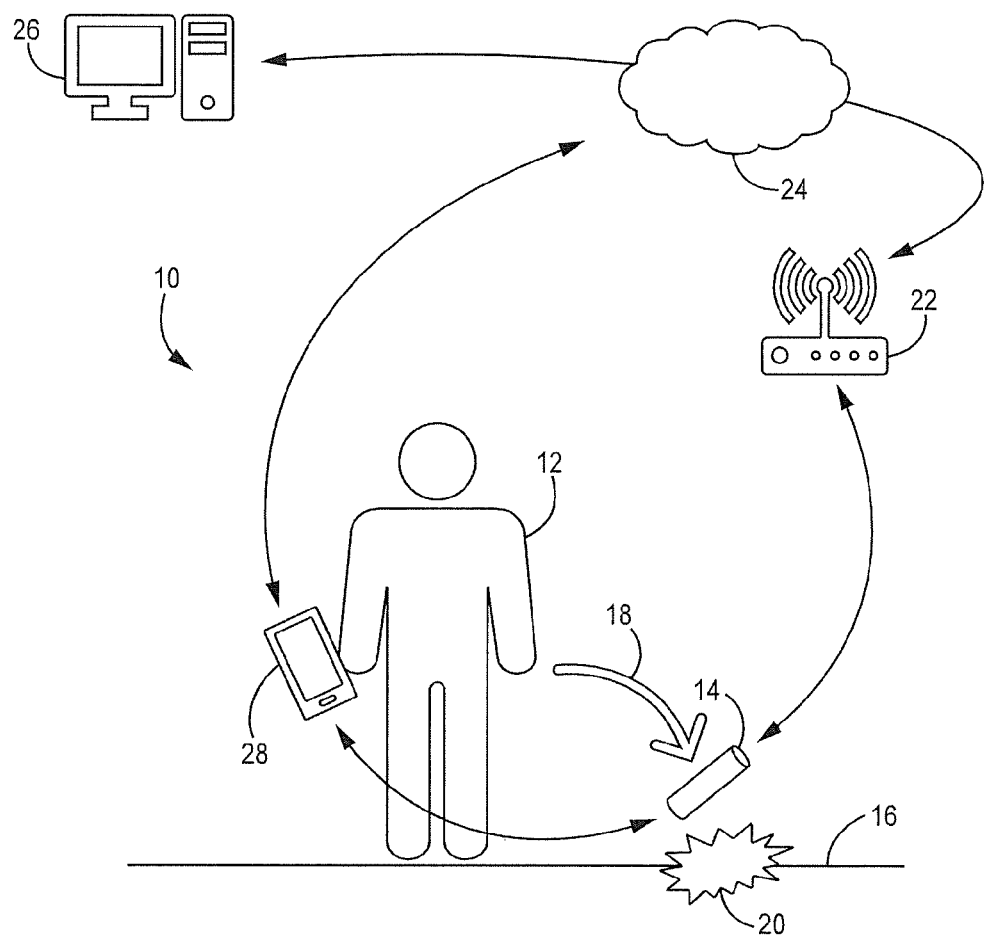
FIG. 1 shows an environment in which a user may use an aerosol-generating device.

FIG. 1 shows an environment 10 in which a user 12 may use aerosol-generating device 14. As illustrated, the aerosol-generating device 14 is falling toward the ground 16. The device 14 may take a trajectory 18, such as a free fall. The device 14 may impact the ground 16, which may result in a shock 20 to the device. An aerosol-device charger may be coupled to the device 14 that may also fall with the device.

The aerosol-generating device 14 may be operably coupled to a remote user device, such as a smartphone 28. The smartphone 28 may be operably coupled to the aerosol-generating device 14 to communicate or transfer data. The smartphone 28 may also be connected to the Internet 24. In some cases, the aerosol-generating device 14 may be connected to the Internet 24 using the smartphone 28.

The aerosol-generating device 14 may be operably coupled to a network 22, such as an LPWAN. The network 22 may be further connected to the Internet 24, a server 26, or both. In some cases, the network 22 may be connected to the server 26 using the Internet 24. When the smartphone 28 cannot connect to the aerosol-generating device 14, the aerosol-generating device may still be able to connect to the network 22.

Figure 2:
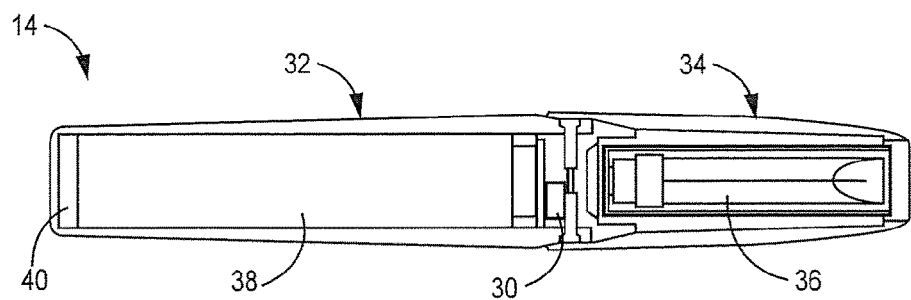
FIG. 2 shows a cross-sectional view of the aerosol-generating device of FIG. 1 having an accelerometer.

FIG. 2 shows a cross-sectional view of the aerosol-generating device 14 having an accelerometer 30. As illustrated, the accelerometer 30 may be coupled to a controller portion 32 of the aerosol-generating device 14. The controller portion may be coupled to the consumable portion 34. The controller portion 32 may include a controller 38 and a power source 40, which may power the accelerometer 30 and other components. The consumable portion 34 may include an aerosol-generating substrate 36, for example, in the form of a cartridge.

Figure 3:
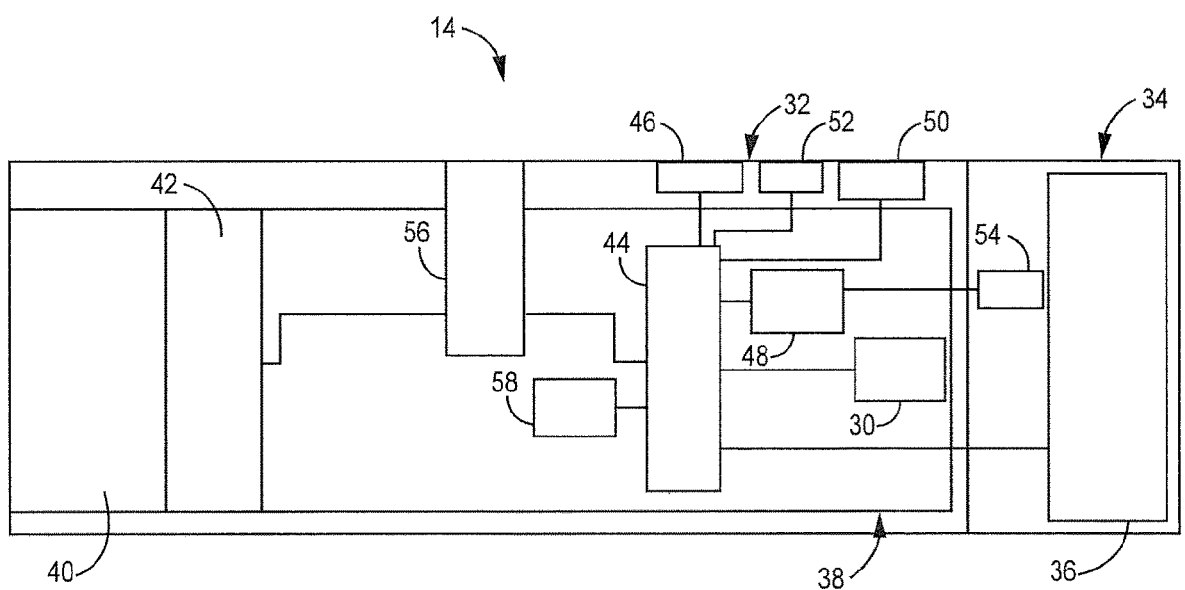
FIG. 3 shows a schematic cross-sectional view of the controller portion and the consumable portion of the aerosol-generating device of FIG. 1.

FIG. 3 shows a schematic cross-sectional view of the aerosol-generating device 14 having the controller portion 32 and the consumable portion 34, which shows various components in more detail. As illustrated, the power source 40 is operably coupled to the controller 38 using a charging interface 42. The power source 40 may be removable.

The controller 38 may include a processor 44, such as a microcontroller. The processor 44 may be configured to carry out various functionality of the device 14. The processor may be operably coupled to a switch 46 to power on or power down the device 14. The processor 44 may be operably coupled to a puff sensor 48 and an aerosolizer 54. The puff sensor 48 may be used to activate the aerosolizer 54 to generate aerosol from the aerosol-generating substrate 36. The processor 44 may be operably coupled to a display 50, such as an LED, and a speaker 52, such as a buzzer 52. The display 50 and speaker 52 may be used to provide human-perceptible information to the user. The speaker 52 may generate a beacon to help the user find the device 14 if lost within a hearing vicinity.

As illustrated, the processor 44 may be operably coupled to the accelerometer 30. In some cases, more than one accelerometer 30 may be operably coupled to the processor 44. The processor 44 may receive acceleration values provided by the accelerometer 30 over time to facilitate the detection of a fall or shock.

The aerosol-generating device 14 may include a communication interface 56. The communication interface 56 may be used to connected over wire, or wirelessly, to external components, such as a charger or a smartphone.

The controller 38 may include a memory 58, or a non-transitory computer readable storage medium. The memory 58 may include a stored computer program that, when run on programmable electric circuitry, such as the processor 44, causes the programmable electric circuitry to execute a method defined by the stored computer program.

Figure 4:
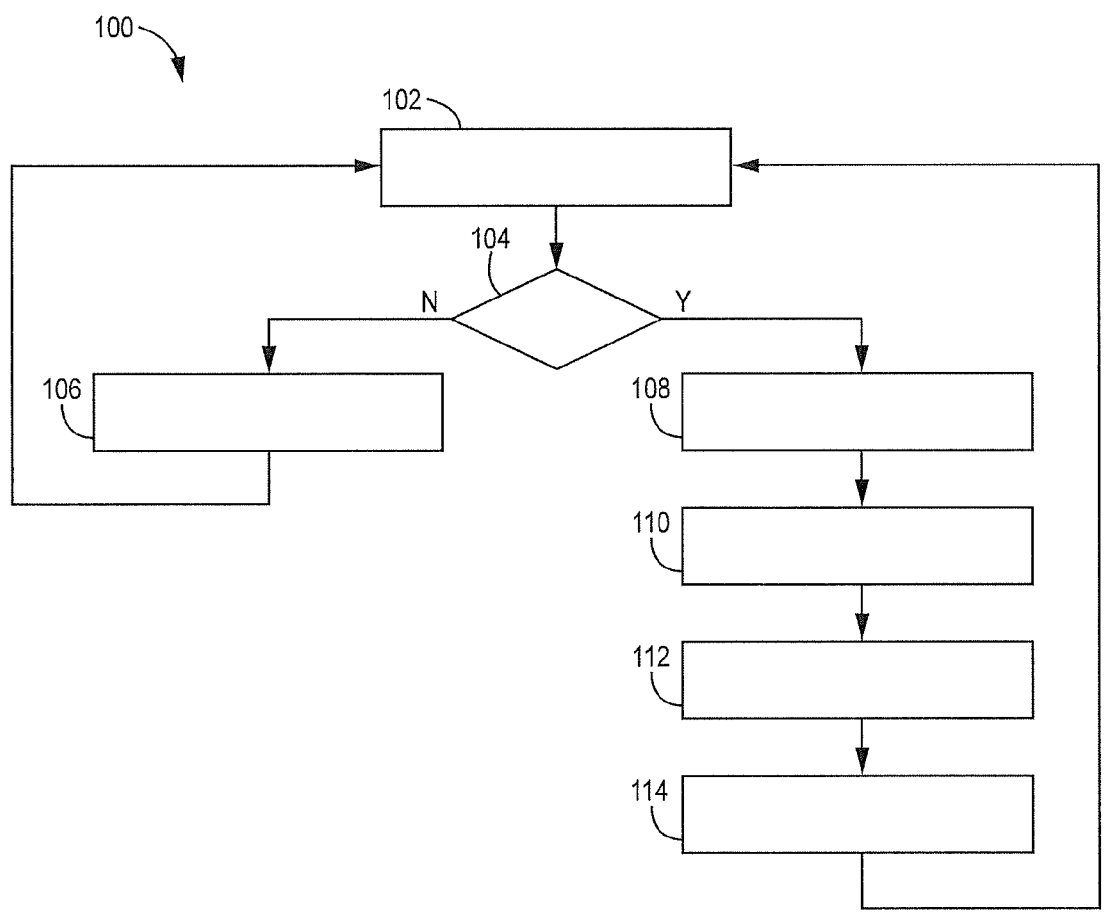
FIG. 4 shows a flowchart view of a method of configuring a device to initiate one or more response procedures after detecting a fall or shock for use with, for example, the aerosol-generating device of FIG. 1.

FIG. 4 shows a flowchart view of a method 100 of configuring a device to initiate one or more response procedures after detecting a fall or shock. The method 100 may begin with process 102, in which the processor of the controller may request at least one acceleration value from the accelerometer. The request may include one or more samples. The requests may be made on a regular basis according to a sampling rate. The method 100 may continue onto process 104.

In process 104, whether the device has experienced a fall or shock is determined based on at least one acceleration value. The end of the fall or shock may also be determined.

If a fall or shock is not detected, the method 100 may continue onto process 106, in which no further actions are taken. The method 100 may repeat process 102. If a fall or shock is detected, the method 100 may continue onto process 108.

In process 108, one or more response procedures may be initiated. For example, the processor of the controller may initiate response procedures some or all response procedures, which may be performed according to a priority sequence or a user preference. In response to a fall, some of the response procedures may be initiated before the end of the fall or shock to mitigate damage. In response to a shock, some of the response procedures may be initiated after the end of the fall or shock to help return the device back to normal operation.

Some response procedures may be initiated in response to certain conditions, such as: a fall or shock, a fall duration exceeding a time threshold, a maximum acceleration value, a fall height exceeding a height threshold, and an impact value exceeding an impact threshold.

The response procedures may include at least one of: initiating a mechanical change in the aerosol-generating device, initiating a modification to an external device interface, initiating a soft shutdown or restart, generating a human-perceptible beacon, monitoring for a lost device condition, storing data associated with the fall or shock in persistent or non-volatile memory, and initiating a diagnostic routine. After initiating the at least one response procedure, the method 100 may continue onto process 110.

In process 110, an initiated response procedure may be carried out by the processor to perform a diagnostic routine to verify that some or all features of the device are functional. Performing the diagnostic routine may include at least one of: performing the diagnostic routine after the end of the fall or shock, writing a flag into a persistent or non-volatile memory to perform the diagnostic routine after a next device start up, displaying a warning related to the fall or shock, and storing a fall or shock in a persistent or non-volatile memory. The method 100 may continue onto process 112.

In process 112, an initiated response procedure may be carried out by the processor to store useful data in non-volatile or persistent memory. Some useful data may only typically be stored in volatile memory. The useful data to store may include at least one of: a fall or shock, a timestamp, a maximum acceleration value, a fall duration, a fall height, an impact value, a diagnostic flag, a static motion duration, a fall count, and a device setting.

Further, some characteristics of the shock or fall may be stored as useful data to non-volatile or persistent memory for later diagnosis or repair. The characteristics may be used to determine the difference between a fall or shock. The method 100 may continue onto process 114.

In process 114, an initiated response procedure may be carried out by the processor to power down the device. The device may be powered down relatively quickly. In particular, the device may be powered down by the time the device makes impact. While the device is powered down, the method 100 may be ended or restarted. For example, the method 100 may return to process 102 after the device has been fully powered on again and the diagnostic routine is completed.

The specific embodiments described above are intended to illustrate the invention. However, other embodiments may be made without departing from the scope of the invention as defined in the claims, and it is to be understood that the specific embodiments described above are not intended to be limiting.

As used herein, the singular forms "a," "an," and "the" encompass embodiments having plural referents, unless the content clearly dictates otherwise.

As used herein, "or" is generally employed in its sense including "and/or" unless the content clearly dictates otherwise. The term "and/or" means one or all of the listed elements or a combination of any two or more of the listed elements.

As used herein, "have," "having," "include," "including," "comprise," "comprising" or the like are used in their open-ended sense, and generally mean "including, but not limited to". It will be understood that "consisting essentially of," "consisting of," and the like are subsumed in "comprising," and the like.

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the disclosure, including the claims.

The invention claimed is:

1. A method for use with an aerosol-generating device having a power source, the method comprising:
   receiving at least one acceleration value;
   detecting a fall or shock based on the at least one acceleration value; and
   initiating, using a controller of the aerosol-generating device, at least one response procedure in response to detecting the fall or shock, wherein the at least one response procedure comprises storing data associated with the fall or shock in persistent or non-volatile memory of the controller.

2. An aerosol-generating device comprising: a power source configured to operably couple to an aerosolizer to generate aerosol from an aerosol-generating substrate; at least one accelerometer configured to measure at least one acceleration value; and a controller operably coupled to the power source and the accelerometer, the controller comprising a processor configured to perform the method of claim 1.

3. A non-transitory computer readable storage medium including a stored computer program that, when run on programmable electric circuitry, causes the programmable electric circuitry to execute the method of claim 1.

4. The method of claim 1, wherein the method further comprises detecting an end of the fall or shock based on the at least one acceleration value.

5. The method of claim 4, wherein at least one of the response procedures is initiated before detecting the end of the fall or shock.

6. The method of claim 4, wherein at least one of the response procedures is initiated after detecting the end of the fall or shock.

7. The method of claim 1, wherein the at least one response procedure comprises initiating a mechanical change comprising at least one of: sealing an aerosol-generating substrate container, unsealing a pressurized container, and electrically and mechanically isolating the power source.

8. The method of claim 1, wherein the data associated with the fall or shock into persistent or non-volatile memory comprises at least one of: a fall or shock, a timestamp, a maximum acceleration value, a fall duration, a fall height, an impact value, a diagnostic flag, a static motion duration, a fall count, and a device setting.

9. The method of claim 8, wherein the method further comprises determining the difference between a fall or shock.

10. The method of claim 1, wherein at least one of the response procedures is initiated in response to at least one of: a fall or shock, a fall duration exceeding a time threshold, a maximum acceleration value, a fall height exceeding a height threshold, and an impact value exceeding an impact threshold.

11. The method of claim 1, wherein the at least one response procedure is initiated according to a priority sequence or a user preference.

12. The method of claim 1, wherein the at least one response procedure further comprises initiating a diagnostic routine, wherein initiating the diagnostic routine comprises at least one of: performing the diagnostic routine after the end of the fall or shock, writing a flag into a persistent or non-volatile memory to perform the diagnostic routine after a next device start up, displaying a warning related to the fall or shock, and storing the fall or shock in a persistent or non-volatile memory.

13. The method of claim 12, wherein the diagnostic routine comprises checking a resistance value of an aerosolizer.

14. The method of claim 1, wherein the at least one response procedure further comprises monitoring for a lost device condition, wherein monitoring for the lost device condition comprises:
    detecting a static position duration of the aerosol-generating device after detecting the fall or shock; and
    communicating a lost signal in response to the static position duration exceeding a lost time threshold.

15. The method of claim 1, wherein the at least one response procedure further comprises initiating a modification to an external device interface, wherein initiating the modification to the external device interface comprises stopping a charging routine between an external power source and the power source of the aerosol-generating device.

16. The method of claim 1, wherein the at least one response procedure further comprises at least one of: initiating a mechanical change in the aerosol-generating device, initiating a soft shutdown or restart, and generating a human-perceptible beacon.

17. The method of claim 15, wherein at least one of the response procedures is initiated after detecting the end of the fall or shock.

18. The method of claim 1, wherein the at least one response procedure further comprises monitoring for a lost device condition, wherein monitoring for the lost device condition comprises:
    detecting a static position duration of the aerosol-generating device after detecting the fall or shock.

19. The method of claim 16, wherein the at least one response procedure comprises initiating a mechanical change comprising at least one of: sealing an aerosol-generating substrate container, unsealing a pressurized container, and electrically and mechanically isolating the power source.

20. The method of claim 17, wherein the at least one response procedure further comprises initiating a diagnostic routine, wherein initiating the diagnostic routine comprises at least one of: performing the diagnostic routine after the end of the fall or shock, writing a flag into a persistent or non-volatile memory to perform the diagnostic routine after a next device start up, displaying a warning related to the fall or shock, and storing the fall or shock in a persistent or non-volatile memory.

* * * * *